United States Patent
Ramaraju

(10) Patent No.: US 7,626,842 B2
(45) Date of Patent: Dec. 1, 2009

(54) PHOTON-BASED MEMORY DEVICE AND METHOD THEREOF

(75) Inventor: Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 388 days.

(21) Appl. No.: 11/560,607

(22) Filed: Nov. 16, 2006

(65) Prior Publication Data

US 2008/0117662 A1 May 22, 2008

(51) Int. Cl.
*G11C 13/04* (2006.01)
*G11C 5/06* (2006.01)

(52) U.S. Cl. .................. 365/64; 365/106; 365/112; 365/215

(58) Field of Classification Search ............... 365/64 O, 365/106 X, 109, 110, 112 X, 215 X, 64, 106, 365/112, 215
See application file for complete search history.

(56) References Cited

U.S. PATENT DOCUMENTS

| | | | |
|---|---|---|---|
| 4,101,975 A | 7/1978 | Brody | |
| 4,250,567 A | 2/1981 | Brody | |
| 4,789,964 A * | 12/1988 | Krilic | 365/115 |
| 5,375,085 A | 12/1994 | Gnade et al. | |
| 5,479,384 A | 12/1995 | Toth et al. | |
| 6,643,159 B2 | 11/2003 | Fricke et al. | |
| 6,781,858 B2 | 8/2004 | Fricke et al. | |
| 7,345,902 B2 * | 3/2008 | Kulasekeram et al. | 365/64 |
| 2002/0085437 A1 | 7/2002 | Huffman et al. | |

OTHER PUBLICATIONS

Han et al., "A Low Dark Curent CMOS Image Sensor Pixel with a Photodiode Structure Enclosed by P-Well," Journal of Semiconductor Technology and Science, vol. 5, No. 2, Jun. 2005, pp. 102-106.
Itkis et al., "Magneto-Opto-Electronic Bistability in a Phenalenyl-Based Neutral Radical," Science Magazine, vol. 296, May 24, 2002, pp. 1443-1445.
Turchetta et al., "Introduction to CMOS Image Sensors," Molecular Expressions: Optical Microscopy Primer-Digital Imaging in Optical Microscopy, copyright 1998-2006, <<http://micro.magnet.fsu.edu/primer/digitalimaging/cmosimagesensors.html>> 13 pages.
Tsuda et al., "Photonic Memory Switch: Monolithic Integration of a Voltage-Controlled Bistable Laser Diode and an Optical Gate", IEEE Photonic Technology Letters, vol. 4, No. 7, Jul. 1992, pp. 760-762.
Zimmerman et al., "A Semiconductor-Based Photonic Memory Cell" Science, vol. 283, Feb. 26, 1999, pp. 1292-1295.
Markoff, John, "A Chip that Can Transfer Data Using Laser Light," http://www.nytimes.com/2006/09/18/technology/18chip.html, Sep. 18, 2006, 3 pages.

* cited by examiner

*Primary Examiner*—VanThu Nguyen

(57) ABSTRACT

A memory device includes a bit cell including an adjustable transmittance component having a first side and a second side. The adjustable transmittance component has an adjustable transmittance state representative of a bit value of the bit cell. The memory device further includes a photon detector optically coupled to a second side of the adjustable transmittance component. A technique related to the memory device includes determining a transmittance state of the adjustable transmittance component and providing a bit value for the bit cell based on the transmittance state. Another technique related to the memory device includes determining a bit value to be stored at the bit cell and configuring the adjustable transmittance component to have a transmittance state corresponding to the bit value.

20 Claims, 5 Drawing Sheets

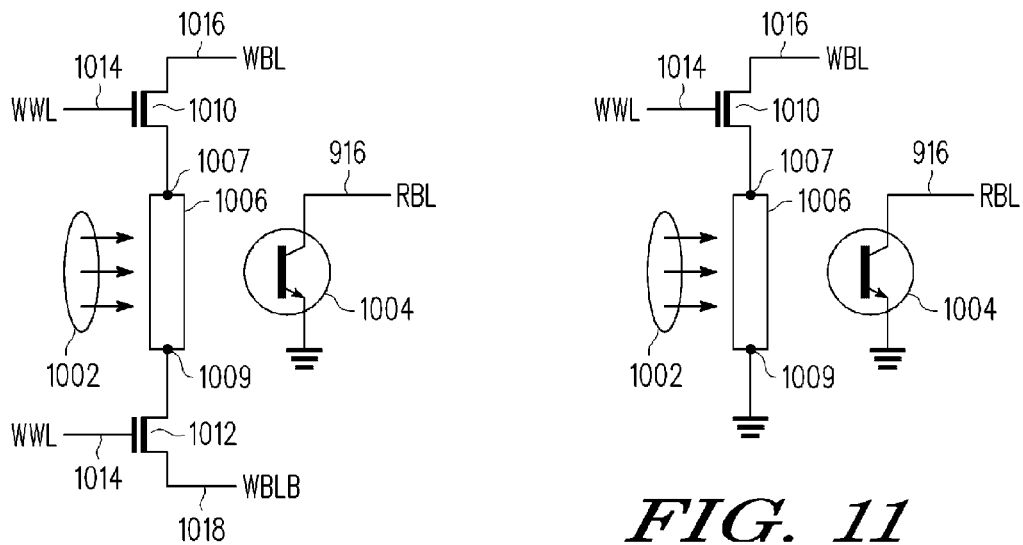
FIG. 10
FIG. 11
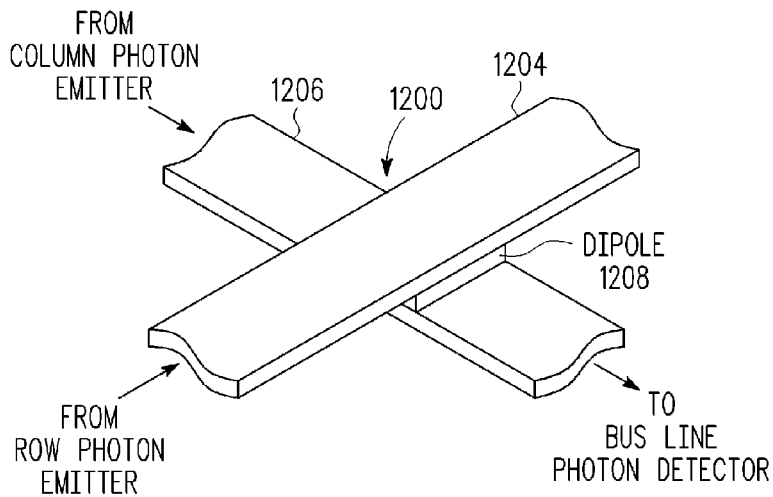
FIG. 12
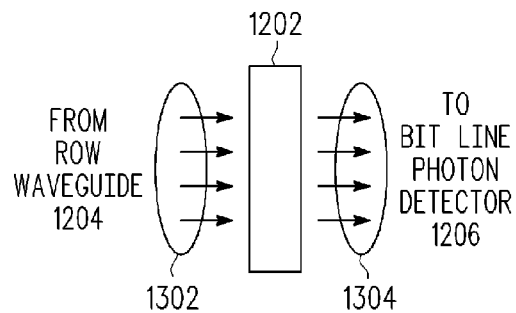
FIG. 13

PHOTON-BASED MEMORY DEVICE AND METHOD THEREOF

FIELD OF THE DISCLOSURE

The present disclosure relates generally to integrated circuit devices and more particularly to memory devices.

BACKGROUND

Memory devices typically are composed of an array of bit cells, with each bit cell having a storage component to store or retain an electrical charge representative of a bit value (e.g., a logic "0" or a logic "1"). However, due to the electrical properties of the bit cells, memory devices typically can operate with relatively low power consumption or at relatively high speed, but not both. Further, memory architectures that operate with relatively low power consumption or operate at relatively high speeds typically are difficult to scale. Flash memories, for example, exhibit relatively low power consumption and are relatively easy to scale but are relatively slow in comparison to other memory architectures, such as static random access memories (SRAMs), which are relatively fast but often are difficult to scale and typically do not operate reliably in low power implementations. Accordingly, an improved technique for storing and retaining data would be advantageous.

BRIEF DESCRIPTION OF THE DRAWINGS

The present disclosure may be better understood, and its numerous features and advantages made apparent to those skilled in the art by referencing the accompanying drawings.

FIG. 10 is a circuit diagram illustrating an implementation of a bit cell of the row of bit cells of FIG. 9 in accordance with at least one embodiment of the present disclosure.

FIG. 11 is a circuit diagram illustrating an implementation of a bit cell of the row of bit cells of FIG. 9 in accordance with at least one embodiment of the present disclosure.

FIG. 12 is a diagram illustrating a perspective view of a bit cell using a row waveguide and a column waveguide in accordance with at least one embodiment of the present disclosure.

FIG. 13 is a diagram illustrating a transmittance of light at the bit cell of FIG. 12 in accordance with at least one embodiment of the present disclosure.

The use of the same reference symbols in different drawings indicates similar or identical items.

DETAILED DESCRIPTION

Figure 1:
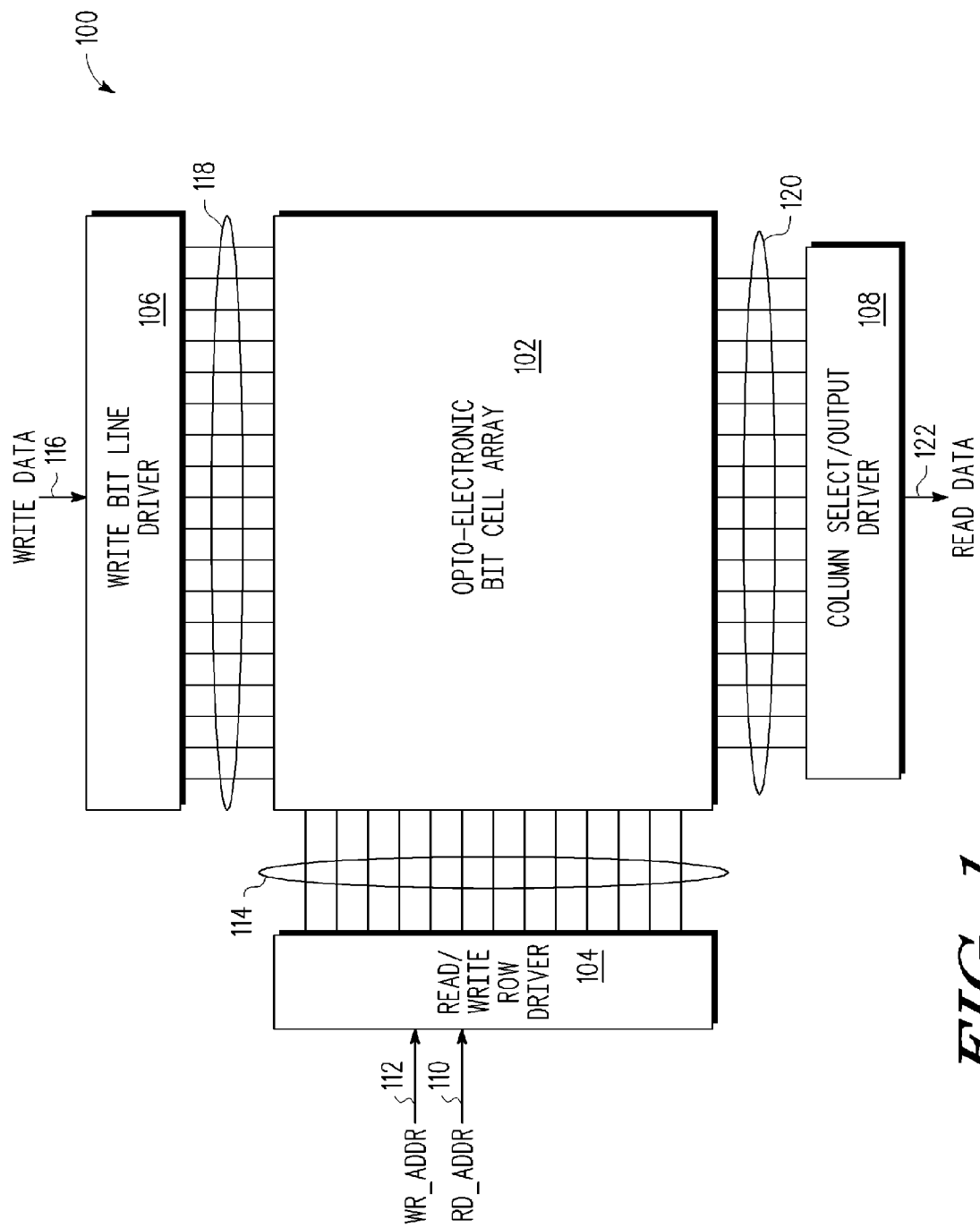
FIG. 1 is a diagram illustrating a memory device in accordance with at least one embodiment of the present disclosure.

In accordance with one aspect of the present disclosure, a memory device includes a bit cell including an adjustable transmittance component having a first side and a second side. The adjustable transmittance component has an adjustable transmittance state representative of at least a bit value of the bit cell. The memory device further includes a photon detector optically coupled to a second side of the adjustable transmittance component.

In accordance with another aspect of the present disclosure, a method is provided for a memory device comprising a bit cell having an adjustable transmittance component having an adjustable transmittance state. The method includes determining a transmittance state of the adjustable transmittance component and providing at least a bit value for the bit cell based on the transmittance state.

In accordance with another aspect of the present disclosure, a method is provided for a memory device comprising a bit cell having an adjustable transmittance component having an adjustable transmittance state. The method includes determining at least a bit value to be stored at the bit cell and configuring the adjustable transmittance component to have a transmittance state corresponding to the bit value.

FIGS. 1-13 illustrate techniques for storing and sensing bit values from bit cells of a memory device based on the transmission of light. In one embodiment, each bit cell the memory device includes an adjustable transmittance component having an adjustable light transmittance, a photon detector disposed at one side of the adjustable transmittance component, and a light source to provide light incident to the opposite side of the adjustable transmittance component, whereby the bit value sensed from the bit cell is based on the transmittance of the adjustable transmittance component. The light source can include, for example, a shared optical waveguide to provide light to a plurality of bit cells (e.g., a row or column of bit cells). Alternately, each bit cell can include a separate photon emitter disposed at the side of the adjustable transmittance component opposite of the photon detector. To write a bit value to a bit cell, the adjustable transmittance component of the bit cell is configured to have a select one of a plurality of transmittance states corresponding to the bit value. To sense a bit value from a bit cell, light is applied to one side of the adjustable transmittance component of the bit cell and the photon detector determines the transmittance state of the adjustable transmittance component based on the detection of photons transmitted through the adjustable transmittance material (or lack thereof), and provides a voltage representative of the determined transmittance state, which is representative of the bit value "stored" at the bit cell. The transmittance state of the adjustable transmittance component of the bit cell can be altered by the application of an electromagnetic stimulus, such as the application of a current or voltage to the adjustable transmittance material of the adjustable transmittance component or the application of a particular frequency (or frequency band) of light that changes the transmittance of the adjustable transmittance material for another frequency of light. In one embodiment, the adjustable transmittance material of the adjustable transmittance component is non-volatile in that it is capable of retaining a programmed transmittance state in the absence of the electromagnetic stimulus, thereby facilitating use of the memory device as non-volatile memory or read-only memory. In another embodiment, the adjustable transmittance material of the adjustable transmittance component is volatile in that it returns to a predetermined transmittance state in the absence of the electromagnetic stimulus, thereby facilitating use of the memory device as volatile memory.

The term "light," as used herein, refers to electromagnetic radiation in the infrared, visible, or ultraviolet spectrum, or combinations thereof, unless noted otherwise. The term "transmittance," as used herein, refers to a measure of the ability of a material to transmit light. The transmittance of the material may be specific to a certain frequency or frequency range of light (e.g., specific to light in the infrared spectrum or specific to a particular color of visible light). The term "adjustable transmittance material," as used herein, refers to a material that has an adjustable transmittance state based on, for example, the application of an electromagnetic stimulus.

For ease of discussion, the optical memory techniques disclosed herein are described in a context whereby each bit cell stores a single bit representing either a zero or a one and thus the adjustable transmittance material can have two different transmittance states to represent either a zero or a one. However, in other embodiments, each bit cell can store more than one bit and thus the adjustable transmittance material can have more than two transmittance states to represent more than one bit without departing from the scope of the present disclosure.

FIG. 1 illustrates a memory device 100 in accordance with at least one embodiment of the present disclosure. The memory device 100 can be implemented as one or more separate integrated circuits (ICs), such as in an application specific integrated circuit (ASIC). Alternately, the memory device 100 can be implemented in another device, such as, for example, a microprocessor or microcontroller implemented as a system-on-a-chip (SOC).

In the depicted example, the memory device 100 comprises a bit cell array 102, a read/write row driver 104, a write bit line driver 106, and a column select/output driver 108. The bit cell array 102 includes an array of bit cells logically arranged as a plurality of rows and columns. Each of the bit cells of the bit cell array 102 includes an adjustable transmittance component having an adjustable transmittance state and a photon detector configured to determine the transmittance state of the adjustable transmittance component upon application of light to a side of the adjustable transmittance component opposite of the photon detector. Each of the bit cells further is configured to provide an output value based on the determined transmittance state, whereby the output value represents the bit value "stored" at the bit cell. Example configurations of the bit cells of the bit cell array 102 are illustrated in detail herein with reference to FIGS. 2-11.

The read/write row driver 104 includes a plurality of inputs to receive signaling associated with read accesses and write accesses to the bit cell array 102. In the example of FIG. 1, these inputs include a read address (RD_ADDR) signal 110 representing a read address value for a read access to a memory location (i.e., set of one or more bit cells) associated with the read address value and a write address signal (WR_ADDR) signal 112 representing a read address value for a write access to a memory location associated with the write address value. The read/write row driver 104 further includes a plurality of outputs connected to the word lines 114 of the bit cell array 102, whereby the word lines 114 include a read word line (RWL) and a write word line (WWL) for each row of the bit cell array 102. For a read access, the read/write row driver 104 is configured to drive, or assert, the appropriate read word line of the word lines 114 based on RD_ADDR signal 110. For a write access, the read/write row driver 104 is configured to drive, or assert, the appropriate write word line of the word lines 114 based on the WR_ADDR signal 112.

The write bit line driver 106 includes an input to receive a write data value 124 and a plurality of outputs connected to write bit lines (WBLs) 118 of the bit cell array 102, whereby the write bit line driver 106 is configured to drive each bit of the write data value 124 onto a corresponding write bit line (and, in one embodiment, the complement bit value onto the complement write bit line).

The column select/output driver 108 includes a plurality of inputs connected to read bit lines (RBLs) 120 of the bit cell array 102 and an output to provide a read data value 122 representing the sequence of bit values sensed by the column select/output driver 108 from a row of bit cells via the read bit lines 120.

For a write access, the read/write row driver receives a write address value represented by the WR_ADDR signal 112 and asserts a write word line of the word lines 114 based on the write address value. Concurrently, the write data value 116 is provided to the write bit line driver 106, whereby the bits of the write data value 116 are provided to the corresponding write bit lines 118 of the bit cell array 102. During the assertion of the write word line, the transmittance states of the adjustable transmittance components of the bit cells associated with the asserted write word line are configured to represent the bit value received via a corresponding write bit line of the write bit lines 118, where the transmittance state of the adjustable transmittance component of a bit cell represents the bit value "stored" by the bit cell. In another embodiment, the adjustable transmittance component of the bit cell can represent more than one bit and thus the transmittance state represents two or more bit values "stored" by the bit cell.

For a read access, the read/write row driver 104 receives a read address value represented by the RD_ADDR signal 110. Based on the read address value, the read/write row driver 104 asserts a read word line of the word lines 114, thereby configuring one or more light sources associated with the asserted read word line to apply light to the side of the adjustable transmittance component opposite of the photon detector of each bit cell associated with the asserted read word line. In one embodiment, each row of bit cells share an optical waveguide, whereby the assertion of the read word line for a row of bit cells configures a photon emitter to apply light to the optical waveguide, whereby the light is distributed among the bit cells of the row. In another embodiment, each bit cell includes its own photon emitter, which is configured to emit light upon the assertion of the corresponding read word line. Concurrently with the application of light to the adjustable transmittance components of the bit cells of the asserted row, the photon detector of each bit cell of the asserted row determines the amount of light transmitted through the adjustable transmittance material and provides an output value based on the determined amount of light or other measurable characteristic of light. The column select/output driver 108 is configured to sense the output values of the row of bit cells enabled by the asserted read word line and provide the sensed output values (or a portion thereof) as the read data value 122.

Figure 2:
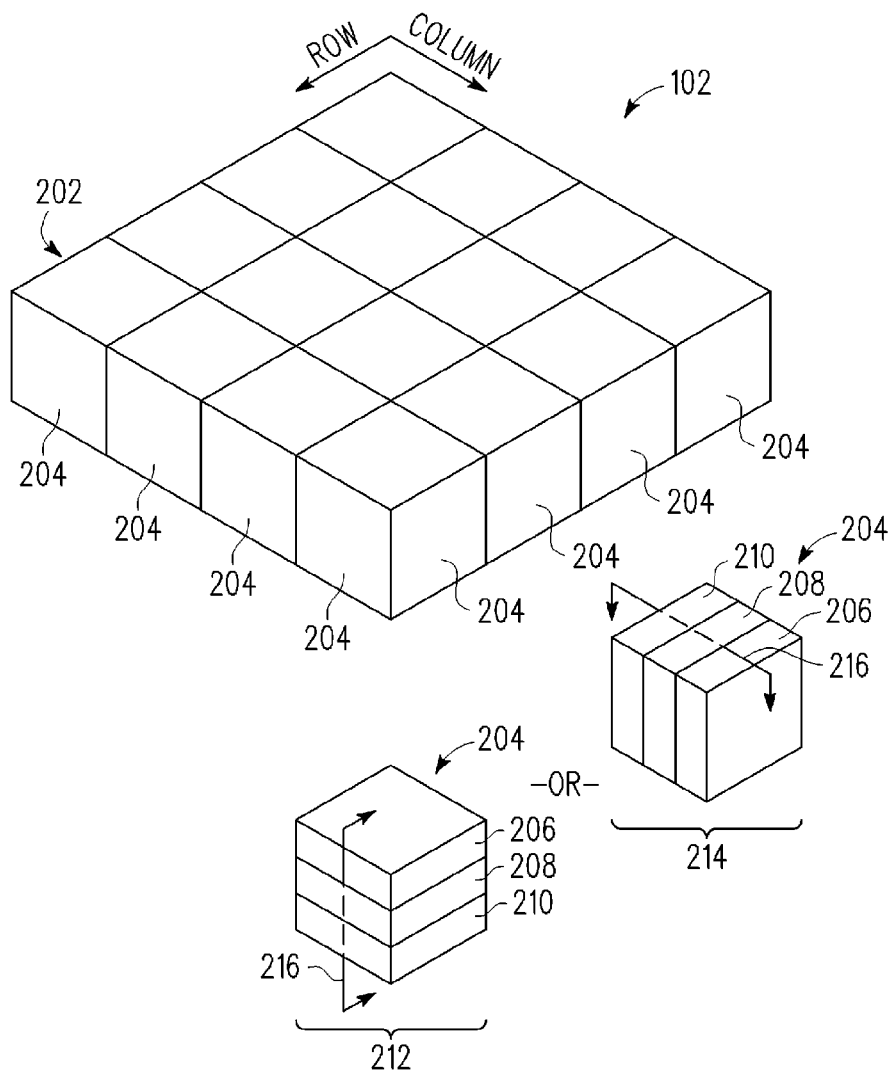
FIG. 2 is a diagram illustrating an implementation of an opto-electronic bit cell array of the memory device of FIG. 1 in accordance with at least one embodiment of the present disclosure.

FIG. 2 illustrates an example implementation of the bit cell array 102 of the memory device 100 of FIG. 1 in accordance with at least one embodiment of the present disclosure. In the depicted example, the bit cell array 102 includes one or more bit cell layers 202 (a single bit cell layer 202 is shown for ease of illustration). Each bit cell layer 202 includes a plurality of bit cells 204 arranged in a matrix of rows and columns. Although the bit cell layer 202 is illustrated in FIG. 2 as a matrix having four rows and four columns, it will be appreciated that the bit cell layer 202 typically will include many more rows and columns in implementation.

Each bit cell 204 includes a photon emitter layer 206, an adjustable transmittance component layer 208, and a photon detector layer 210, whereby the adjustable transmittance component layer 208 is substantially disposed between the photon emitter layer 206 and the photon detector layer 210. The photon emitter layer 206 includes a photon emitter, such as a light emitting diode (LED), a laser diode, a laser, and the like. The photon detector layer 206 includes a photon detector, such as a photo diode or a photo transistor. The adjustable transmittance component layer 208 includes an adjustable transmittance component having adjustable transmittance material disposed between the photon emitter of the photon emitter of the photon emitter layer 206 and the photon detector of the photon detector layer 210 such that all or substantially all light emitted by the photon emitter and detected by the photon detector passes through the adjustable transmittance material. The adjustable transmittance material can include any of a variety of materials having an adjustable transmittance state, such as, for example, a phenalenyl-based neutral organic radical material, polymer dispersed liquid crystal (PDLC) material, cholesteric liquid crystal material, nematic liquid crystal material, ferroelectric liquid crystal (FLC) material, doped vanadium dioxide, and the like. Read/write logic, signaling components, and interconnects can be implemented in some or all of the layers 206, 208, and 210.

As illustrated by arrangement 212, the layers 206, 208, and 210 can be arranged in a stacked configuration perpendicular to the plane of the bit cell layer 202. As illustrated by arrangement 214, the layers 206, 208, and 210 can be arranged in a stacked configuration parallel with the plane of the bit cell layer 202.

Figure 3:
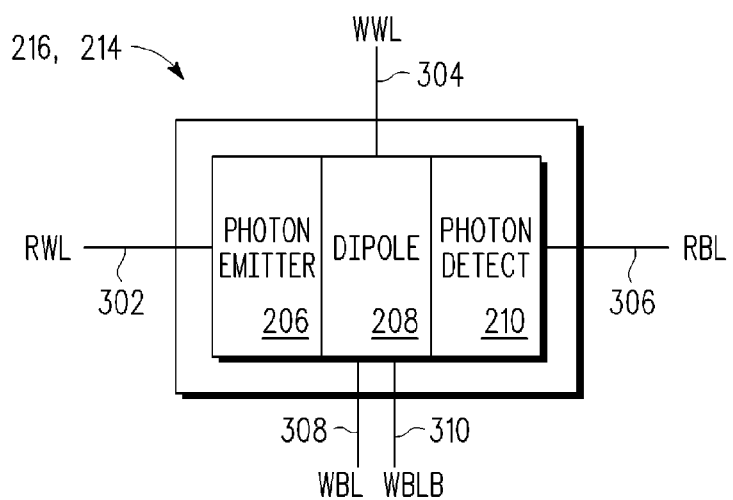
FIG. 3 is a layer diagram illustrating a bit cell of the opto-electronic bit cell array of FIG. 2 in accordance with at least one embodiment of the present disclosure.

FIG. 3 illustrates a cross-section view 216 of the bit cell 204 of FIG. 2 in accordance with at least one embodiment of the present disclosure. As depicted, the photon emitter layer 206 can include an input connected to a read word line (RWL) 302, wherein the photon emitter of the photon emitter layer 206 is configured to emit light in response to an assertion of the read word line 302. The adjustable transmittance component layer 208 can include an input connected to a write word line (WWL) 304 and inputs connected to a write bit line (WBL) 308 and its complement write bit line (WBLB) 310, wherein the adjustable transmittance component of the adjustable transmittance component layer 208 can be configured to have a particular transmittance state in response to an assertion of the write word line 304 based on the bit value represented by the write bit line 308 and its complement write bit line 310. The photon detect layer 210 can include an output connected to a read bit line (RBL) 306, whereby the photon detect layer 210 is configured to detect light, and thus detect the transmittance state of the adjustable transmittance component, and provide an output value to the read bit line 306 based on the amount of light detected. Further, in one embodiment, the bit cell 204 can include an optical shield 312 overlaying at least some exterior surfaces of the layers 206, 208 and 210 so as to reduce or eliminate errant light transmission to adjoining cells.

Figure 4:
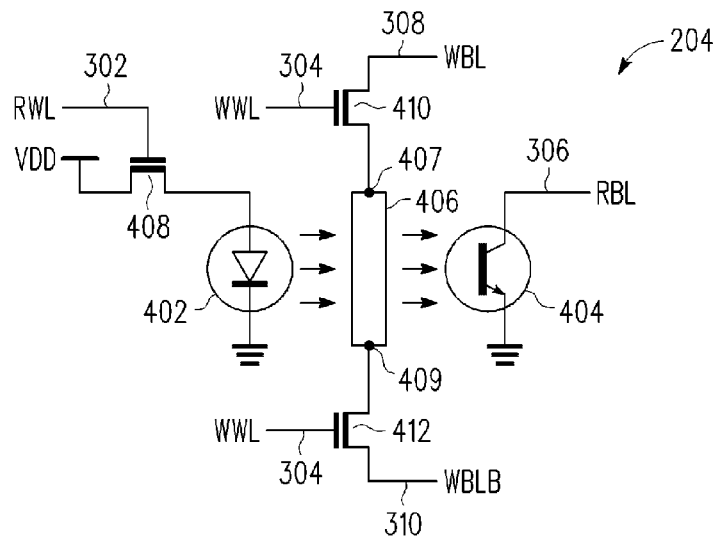
FIG. 4 is a circuit diagram illustrating an implementation of the bit cell of FIG. 3 in accordance with at least one embodiment of the present disclosure.
Figure 5:
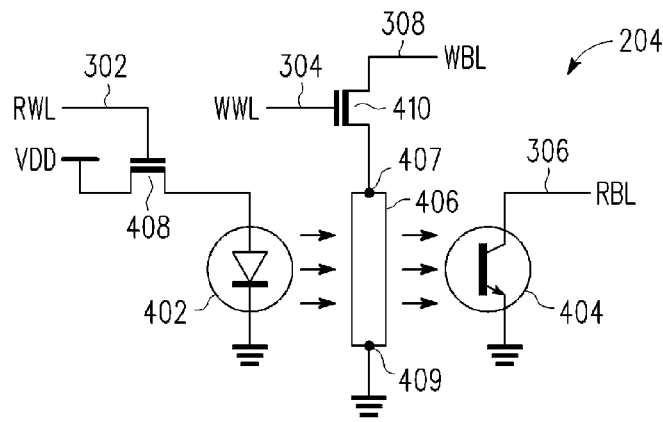
FIG. 5 is a circuit diagram illustrating another implementation of the bit cell of FIG. 3 in accordance with at least one embodiment of the present disclosure.

FIGS. 4 and 5 illustrates various circuit implementations of the bit cell 204 of FIGS. 2 and 3 in accordance with at least one embodiment of the present disclosure. In the example of FIG. 4, the bit cell 204 includes a photon emitter 402 (illustrated as a photo diode), a photon detector 404 (illustrated as a photo transistor), and an adjustable transmittance component 406 disposed between the photon emitter 402 and the photon detector 404. The photon emitter 402 includes an electrode to receive a current to enable the photon emitter 402 to emit light and an electrode connected to a low voltage reference (e.g., GND). The photon detector 404 includes an electrode connected to the low voltage reference and an electrode connected to the read bit line 306.

The bit cell 204 further includes transistors 408, 410, and 412. The transistor 408 includes a control electrode connected to the read word line 302, a current electrode connected to a high voltage reference (e.g., VDD), and a current electrode connected to an electrode of the photon emitter 402. The transistor 410 includes a control electrode connected to the write word line 304, a current electrode connected to the write bit line 308, and a current electrode connected to the node 407 of the adjustable transmittance component 406. The transistor 412 includes a control electrode connected to the write word line 304, a current electrode connected to the complement write bit line 310, and a current electrode connected to the node 407 of the adjustable transmittance component 406.

In the illustrated example, the adjustable transmittance component 402 includes an adjustable transmittance material that assumes a first transmittance state (e.g., a substantially transparent state) when a current is driven from node 407 to node 409 of the adjustable transmittance component 402 and that assumes a second transmittance state (e.g., a substantially opaque state) when a current is driven from node 409 to node 407.

To write a bit value to the bit cell 204, the write word line 304 is asserted, thereby enabling the transistors 410 and 412. The bit value and its complement are driven on the write bit line 308 and the complement write bit line 310, respectively, thereby resulting in a current between nodes 407 and 409 of the adjustable transmittance component 406. The direction of the current, and thus the transmittance state of the adjustable transmittance component 406, depends on the voltage relationship between the bit value and its complement. Accordingly, the bit value "stored" at the bit cell 204 is represented by the configured transmittance state of the adjustable transmittance component 406 resulting from the current created by the write bit line 308 and the complement write bit line 310.

To read the bit value from the bit cell 204, the read word line 306 is asserted, thereby enabling the transistor 408, which results in current flow from the high voltage reference to the electrode of the photon emitter 402 and the photon emitter 402 emits light in response to the current flow through the photon emitter 402, a portion of which encounters one side of the adjustable transmittance material of the adjustable transmittance component 406. The photon detector 404 detects the light (if any) that traverses through the other side of the adjustable transmittance material and provides an output voltage to the read bit line 306 based on the amount of detected light. Thus, because the proportion of the light that transmits through the adjustable transmittance component 406 is based on the transmittance state of the adjustable transmittance material of the adjustable transmittance component 406, the output voltage provided by the photon detector 404 is representative of the transmittance state of the adjustable transmittance material and thus is representative of the bit value "stored" at the bit cell 204.

In the example of FIG. 5, rather than the double-ended implementation of FIG. 4 whereby the transistor 412 connects the node 409 of the adjustable transmittance component 406 to the complement write bit line 310 (FIG. 3), in the illustrated single-ended implementation, the node 409 is connected to the low voltage reference. Accordingly, the magnitude and sign of the voltage driven on the write bit line 308 can be adjusted to achieve the current magnitude and direction between the nodes 407 and 409 used to configure the adjustable transmittance material of the adjustable transmittance component to have the desired transmittance state.

In one embodiment, the adjustable transmittance material of the adjustable transmittance component 406 can be configured to have more than two transmittance states and thus the bit cell 204 can be configured to store more than two values. To illustrate, the adjustable transmittance material may configurable to have a fully opaque state (representing, for example, a bit value "00"), a moderately opaque state (representing, for example, a bit value "01"), a moderately transparent state (representing, for example, a bit value "10"), and a fully transparent state (representing, for example, a bit value "11") depending on the direction and the magnitude of the current generated between nodes 407 and 409. Thus, the write bit line 308 and the complement write bit line 310 can be configured to drive any of a variety of voltage levels so as to vary the magnitude and direction of the resulting current between nodes 407 and 409 so as to configure one of a plurality of transmittance states for the adjustable transmittance component 406. Further, it will be appreciated that the output voltage of the photon detector 404 typically is based on the number of photons detected and thus is dependent on the transmittance state of the adjustable transmittance component 406. Accordingly, in order to detect more than two bit values for the bit cell 204, the bit cell 204, or alternately the column select/output driver 108 (FIG. 1), can include an analog-to-digital converter at the output of the photon detector 306 so as to convert the various possible voltage levels output by the photon detector 306 in response to the various possible transmittance states to the corresponding multiple bit values.

Figure 6:
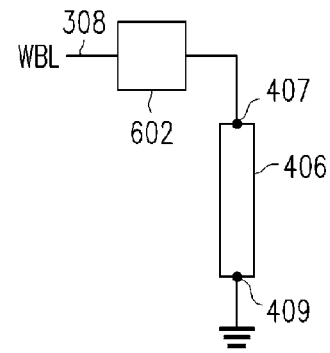
FIG. 6 is a circuit diagram illustrating a storage component for an adjustable transmittance layer of the bit cell of FIG. 4 or FIG. 5 in accordance with at least one embodiment of the present disclosure.

FIG. 6 illustrates an example implementation of the adjustable transmittance component 406 in accordance with at least one embodiment of the present disclosure. In some implementations, the adjustable transmittance material of the adjustable transmittance component 406 may be a volatile adjustable transmittance material in that it regresses back to a base transmittance state after a programming stimulus (e.g., a current between nodes 407 and 409) ceases. Accordingly, in one embodiment, the bit cell 204 further can include a bit storage component 602 to maintain the application of the programming stimulus to the adjustable transmittance component 406 during operation of the memory device 100 (FIG. 1). The bit storage component 602 can include, for example, a capacitor that is refreshed periodically, as is found in certain dynamic random access memory (DRAM) architectures. Alternately, the bit storage component 406 can include a latch component, such as cross-coupled inverters that can be found in certain static random access memory (SRAM) architectures, to store the bit value of the write bit line 308 as a voltage and to continually apply the voltage to the adjustable transmittance component 406.

Figure 7:
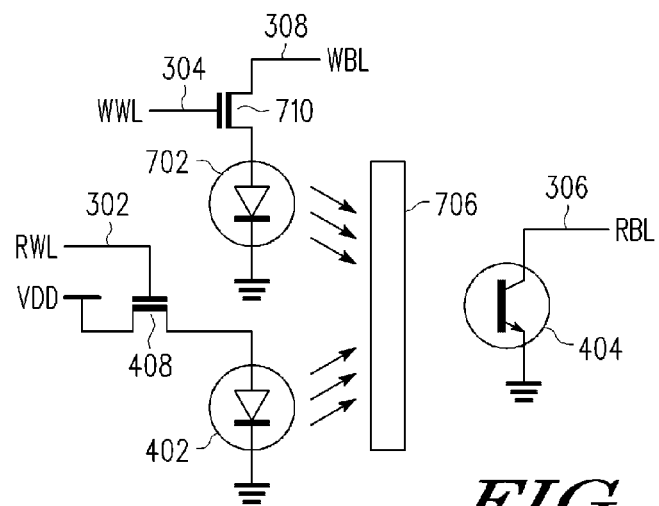
FIG. 7 is a circuit diagram illustrating yet another implementation of the bit cell of FIG. 3 in accordance with at least one embodiment of the present disclosure.

FIG. 7 illustrates another implementation of the bit cell 204 in accordance with at least one embodiment of the present disclosure. It will be appreciated that although FIG. 7 illustrates a single-ended implementation, a double-ended implementation similar to the one illustrated by FIG. 4 may be implemented.

As with the implementation illustrated in FIG. 3, the implementation of FIG. 7 includes the photon emitter 402, the photon detector 404, and an adjustable transmittance component 706 disposed in between. The adjustable transmittance component 706, in one embodiment, implements an adjustable transmittance material that has a transmittance state for a certain light frequency (or frequency range) that can be adjusted based on the application of light having a different frequency. To illustrate, the transmittance state of the adjustable transmittance material with respect to visible light may be altered by the application of ultraviolet light to the adjustable transmittance material.

Thus, the bit cell 204, in one embodiment, includes a photon emitter 702 having an electrode connected to the low voltage reference and an electrode connected to the write bit line 308 via a transistor 710 controlled by the write word line 710, whereby the photon emitter 702 is configured to emit light at a frequency that changes the transmittance state of the adjustable transmittance material of the adjustable transmittance component 706 with respect to the frequency of light emitted by the photon emitter 402. Accordingly, the word line 304 and the write bit line 308 can be asserted so as to "program" the transmittance state of the adjustable transmittance component 706 with respect to the light emitted by the photon emitter 402.

Figure 8:
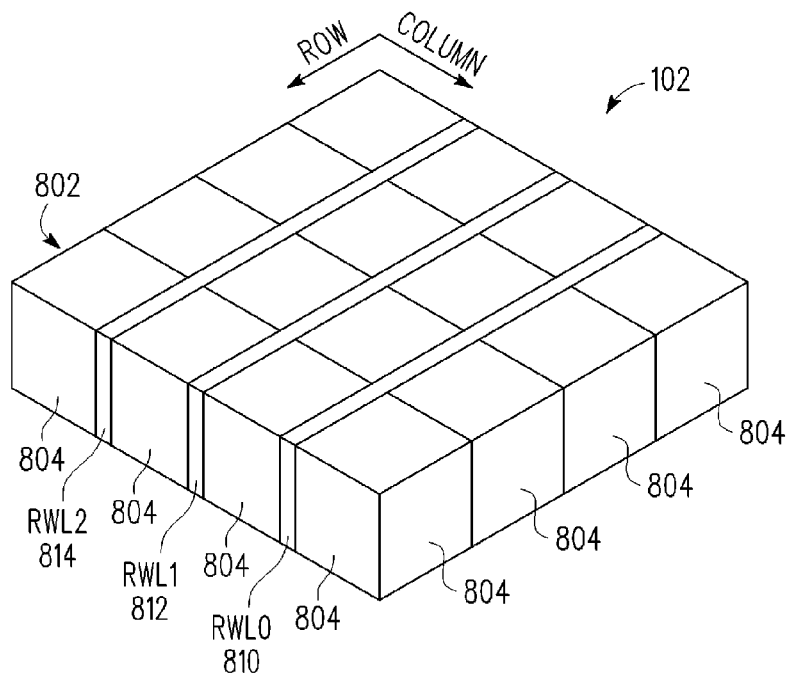
FIG. 8 is a diagram illustrating another implementation of the opto-electronic bit cell array of the memory device of FIG. 1 in accordance with at least one embodiment of the present disclosure.

FIG. 8 illustrates another example implementation of the bit cell array 102 of FIG. 1 in accordance with at least one embodiment of the present disclosure. In the depicted example, the bit cell array 102 includes one or more bit cell layers 802 (one bit cell layer 802 is shown for ease of illustration). Each bit cell layer 802 includes a plurality of bit cells 804 arranged in a matrix of rows and columns. Although the bit cell layer 802 is illustrated in FIG. 8 as a matrix having four rows and four columns, it will be appreciated that the bit cell layer 802 typically will include many more rows and columns.

As with the bit cell 204 illustrated at FIG. 2, each bit cell 804 includes an adjustable transmittance component layer and a photon detector layer. However, rather than implementing a photon emitter at each bit cell, in one embodiment, the bit cell layer 802 includes a plurality of optical waveguides (such as optical waveguides 810, 812, and 814), each optical waveguide distributing light from a photon emitter to a plurality of bit cells. The optical waveguides can be disposed between the rows of bit cells, as illustrated in FIG. 8, or the optical waveguides can be disposed on top of, or below, the rows of bit cells. In the example of FIG. 8, the optical waveguides 810, 812, and 814 each are configured to distribute light to a row of bit cells 804. Each bit cell 804 therefore includes an optical coupler between the corresponding waveguide and the surface of the adjustable transmittance component of the bit cell 804 opposite of the photon detector of the bit cell 804.

It will be appreciated that the read bit lines can be implemented as optical waveguides in addition to, or instead of, the implementation of the read word lines as optical waveguides. To illustrate, the bit cells each can include a photon emitter and an optical waveguide coupling to another waveguide that serves as the read bit line for a column of bit cells, whereby the photon emitter can be activated by a read word line and the light emitted by the photon emitter can be transferred to the optical waveguide or blocked from being transferred to the optical waveguide based on the transmittance state of the adjustable transmittance component of the bit cell. An implementation of the bit cell using both row-based waveguides and column/read bit line-based waveguides is illustrated herein with reference to FIGS. 12 and 13.

Figure 9:
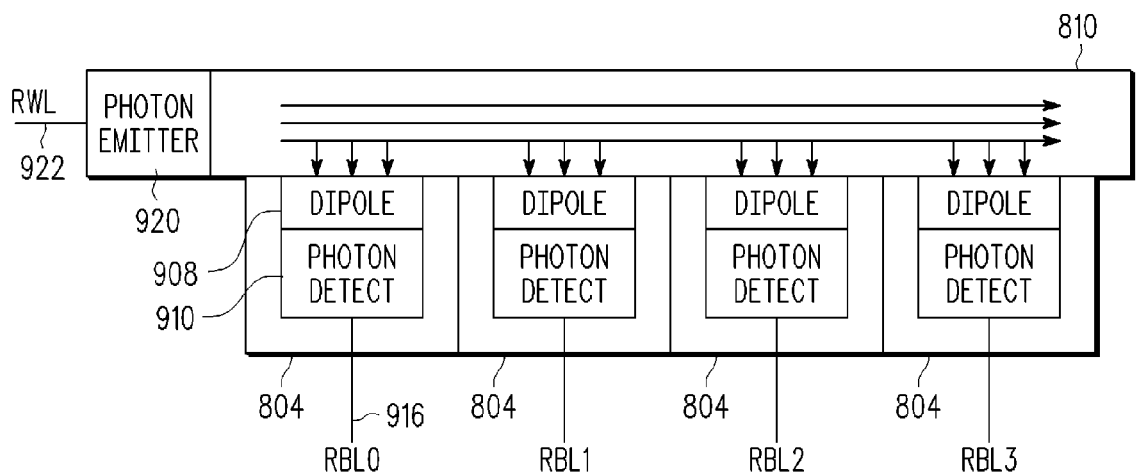
FIG. 9 is a diagram illustrating a row of bit cells of the opto-electronic bit cell array of FIG. 8 in accordance with at least one embodiment of the present disclosure.

FIG. 9 illustrates a cross-section view of a row of the bit cells 804 and the optical waveguide 810 of FIG. 7 in accordance with at least one embodiment of the present disclosure. In the depicted example, each of the bit cells 804 includes an adjustable transmittance layer 908, a photon detector layer 910, and an optical shield layer 912. The adjustable transmittance layer 908 implements an adjustable transmittance component composed of adjustable transmittance material optically connected to the optical waveguide 810 at one side and optically coupled to a photon detector of the photon detector layer 910 on the opposite side. The output of the photon detector is connected to a corresponding read bit line 916 (e.g., read bit lines RBL0-RBL3). The write word lines and the write bit lines of the bit cells 804 are omitted in FIG. 8 for ease of illustration. Optically connected to one end of the optical waveguide 810 is a photon emitter 920 having an input connected to a corresponding read word line 922.

For a write access, the adjustable transmittance component of the bit cell 804 can be configured to have a transmittance state representative of a corresponding bit value or set of bit values as discussed above with reference to FIGS. 3-7. For a read access to the row of bit cells associated with the optical waveguide 810, the read word line 922 is asserted, thereby configuring the photon emitter 920 to emit light, which is distributed by the optical waveguide 810 among the bit cells 804 of the row. The light emitted from the optical waveguide 810 is applied to the surface of the adjustable transmittance component 908 of the bit cells 804 facing the optical waveguide 810 and the photon detector 910 on the opposite side of the adjustable transmittance component 908 detects the amount of light, if any, transmitted through the adjustable transmittance component 908 of the bit cell 804, which depends on the transmittance state of the adjustable transmittance component 908. The photon detector 910 provides an output voltage representative of the amount of light detected, which is representative of the transmittance state of the adjustable transmittance component 910 of the bit cell 804 and thus the bit value or bit values "stored" at the bit cell 804.

FIGS. 10 and 11 illustrate various circuit implementations of the bit cell 804 in accordance with at least one embodiment of the present disclosure. In the example of FIG. 10, the bit cell 804 includes an optical coupler 1002 optically connected to an optical waveguide of the bit cell array 102 (FIG. 8), a photon detector 1004 (illustrated as a photo transistor), and an adjustable transmittance component 1006 having one surface optically connected to the optical coupler 1002 and an opposing surface optically coupled to the photon detector 1004. The photon detector 404 includes an electrode connected to a low voltage reference (e.g., GND) and an electrode connected to the read bit line 916.

The bit cell 804 further includes transistors 1010 and 1012. The transistor 1010 includes a control electrode connected to a write word line 1014, a current electrode connected to a write bit line 10168, and a current electrode connected to the node 1007 of the adjustable transmittance component 1006. The transistor 1012 includes a control electrode connected to the write word line 1014, a current electrode connected to a complement write bit line 1018, and a current electrode connected to the node 409 of the adjustable transmittance component 1006.

As with the example of FIG. 4, in one embodiment, the adjustable transmittance component 1006 includes an adjustable transmittance material that assumes a transmittance state depending on the magnitude and direction of a current applied between nodes 1007 and 1009. For a write access, the write bit line 1016 and the complement write bit line 1018 can be configured so as to generate a current of the appropriate magnitude and direction for the desired transmittance state.

To read the bit value from the bit cell 804, the photon emitter 920 (FIG. 9) is activated so as to emit light, which is transmitted along the optical waveguide 810 (FIG. 9) and through the optical coupler 1002, whereupon it encounters one side of the adjustable transmittance material of the adjustable transmittance component 1006. The photon detector 1004 detects the light (if any) that traverses through the other side of the adjustable transmittance material and provides an output voltage to the read bit line 1016 based on the amount of detected light. Thus, because the proportion of the light that transmits through the adjustable transmittance component 1006 is based on the transmittance state of the adjustable transmittance material of the adjustable transmittance component 1006, the output voltage provided by the photon detector 1004 is representative of the transmittance state of the adjustable transmittance material and thus is representative of the bit value "stored" at the bit cell 804.

In the example of FIG. 11, rather than the double-ended implementation of FIG. 10 whereby the transistor 1012 connects the node 1009 of the adjustable transmittance component 1006 to the complement write bit line 1018, in the illustrated single-ended implementation, the node 1009 is connected to the low voltage reference and the magnitude and sign of the voltage driven on the write bit line 1016 can be adjusted to achieve the current magnitude and direction between the nodes 1007 and 1009 used to configure the adjustable transmittance material of the adjustable transmittance component 1006 to have the desired transmittance state.

Further, in one embodiment, the adjustable transmittance component 1006 can be configured to have more than two transmittance states and thus the bit cells 804 can be used to store multiple bit value based on the plurality of possible transmittance states. Also, the bit cells 804 alternately can be configured in a manner similar to the implementation of FIG. 6 whereby the transmittance state of the adjustable transmittance component 1006 can be configured with respect to one frequency of light based on the application of light having a different frequency.

FIGS. 12 and 13 illustrate another example implementation of the bit cell array 102 of FIG. 1 in accordance with at least one embodiment of the present disclosure. In the depicted example of FIG. 12, the bit cell array 102 includes a plurality of bit cells 1200, each bit cell 1200 disposed at a corresponding intersection between a row waveguide 1204 and a column waveguide 1206. The row waveguide 1204 is optically coupled to a photon emitter such that the row waveguide 1204 acts in effect as a read word line for the bit cell array 102. The column waveguide 1204 is optically coupled to a photon emitter such that the column waveguide 1204 acts in effect as a read bit line for the bit cell array 102. The bit cell 1200 includes an adjustable transmittance component 1202 disposed between the row waveguide 1204 and the column waveguide 1206 such that light is transferred from the row waveguide 1204 to the column waveguide 1206 based on the transmittance state of the adjustable transmittance component 1202. Accordingly, as illustrated by FIG. 13, light can be applied to the row waveguide 1204 and the bit value "stored" by the bit cell 1202 can be determined based on whether the adjustable transmittance component 1202 permits light to be transferred from the to the column waveguide 1206 via optical couplers 1302 and 1304 disposed at opposing sides of the adjustable transmittance component 1202.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

What is claimed is:

1. A memory device comprising:
   a bit cell comprising an adjustable light transmittance component having a first side and a second side, the adjustable light transmittance component having an adjustable light transmittance state representative of at least a bit value of the bit cell; and
   a photon detector optically coupled to a second side of the adjustable light transmittance component.

2. The memory device of claim 1, further comprising:
   a plurality of read word lines; and
   a photon emitter optically coupled to the first side of the adjustable light transmittance component, the photon emitter comprising an input coupleable to a corresponding read word line of the plurality of read word lines.

3. The memory device of claim 1, wherein a photon emitter is disposed at the first side of the adjustable light transmittance component.

4. The memory device of claim 2, wherein the photon emitter is optically coupled to the first side of the adjustable light transmittance component via an optical waveguide associated with a group of bit cells of the memory device.

5. The memory device of claim 3, wherein the photon detector is disposed at the second side of the adjustable light transmittance component.

6. The memory device of claim 1, wherein the bit cell further comprises:
   a transistor comprising a first current electrode coupleable to a corresponding write word line of the memory device, a second current electrode coupled to a node of the adjustable light transmittance component, and a control electrode coupleable to a corresponding write bit line of the memory device.

7. The memory device of claim 1, further comprising:
   a memory array comprising a plurality of bit cells including the bit cell, wherein each of the plurality of bit cells comprises an adjustable light transmittance component having a first side and a second side, the adjustable light transmittance component having an adjustable light transmittance state representative of at least a bit value of the bit cell.

8. In a memory device comprising a bit cell comprising an adjustable light transmittance component having an adjustable light transmittance state, a method comprising:
   determining a light transmittance state of the adjustable light transmittance component; and
   providing at least a bit value for the bit cell based on the light transmittance state.

9. The method of claim 8, wherein determining the light transmittance state of the adjustable light transmittance component comprises detecting light at a photon detector optically coupled to a side of the adjustable light transmittance component.

10. The method of claim 8, wherein determining the light transmittance state of the adjustable light transmittance component comprises:
    applying light to a first side of the adjustable light transmittance component; and
    determining whether light is detected at a second side of the adjustable light transmittance component in response to the application of light to the first side of the adjustable light transmittance component;
    wherein the adjustable light transmittance component is determined to have a first light transmittance state when light is detected at the second side of the adjustable light transmittance component; and
    wherein the adjustable light transmittance component is determined to have a second light transmittance state when light is not detected at the second side of the adjustable light transmittance component.

11. The method of claim 10, wherein providing at least a bit value for the bit cell comprises:
    providing a first bit value for the bit cell in response to determining the adjustable light transmittance component has the first light transmittance state; and
    providing a second bit value for the bit cell in response to determining the adjustable light transmittance component has the second light transmittance state.

12. The method of claim 10, wherein applying light to a first side of the adjustable light transmittance component comprises:
    activating a photon emitter disposed at the first side of the adjustable light transmittance component.

13. The method of claim 10, wherein applying light to a first side of the adjustable light transmittance component comprises:
    applying light to the first side of the adjustable light transmittance component via an optical waveguide.

14. The method of claim 8, further comprising:
    determining a bit value to be stored at the bit cell; and
    configuring the adjustable light transmittance component to have a light transmittance state representative of the bit value.

15. The method of claim 14, wherein configuring the adjustable light transmittance component to have a light transmittance state comprises:
    applying an electromagnetic input to the adjustable light transmittance component to change a light transmittance characteristic of the adjustable light transmittance component.

16. The method of claim 15, wherein applying the electromagnetic input to the adjustable light transmittance component comprises applying a current to the adjustable light transmittance component based on a write word line and a write bit line associated with the bit cell.

17. The method of claim 15, wherein the light transmittance state is associated with light having a first frequency and wherein applying the electromagnetic input comprises applying light having a second frequency to the adjustable light transmittance component.

18. In a memory device comprising a bit cell comprising an adjustable light transmittance component having an adjustable light transmittance state, a method comprising:
    determining a bit value to be stored at the bit cell; and
    configuring the adjustable light transmittance component to have a light transmittance state corresponding to the bit value.

19. The method of claim 18, wherein configuring the adjustable light transmittance component to have a light transmittance state comprises:

applying an electromagnetic input to the adjustable light transmittance component to change a light transmittance characteristic of the adjustable light transmittance component.

20. The method of claim 19, wherein the light transmittance state is associated with light having a first frequency and wherein applying the electromagnetic input comprises applying light having a second frequency to the adjustable light transmittance component.

* * * * *